US012765301B2

(12) United States Patent
Choi et al.

(10) Patent No.: US 12,765,301 B2
(45) Date of Patent: Oct. 13, 2026

(54) APPARATUS AND METHOD FOR SUPPLYING GAS, FACILITY FOR PROCESSING SUBSTRATE

(71) Applicant: SEMES CO., LTD., Chungcheongnam-do (KR)

(72) Inventors: Hae Won Choi, Chungcheongnam-do (KR); Hong Chan Cho, Chungcheongnam-do (KR); Eun Mi Kim, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 638 days.

(21) Appl. No.: 18/105,796

(22) Filed: Feb. 3, 2023

(65) Prior Publication Data

US 2023/0369074 A1 Nov. 16, 2023

(30) Foreign Application Priority Data

May 11, 2022 (KR) ........................ 10-2022-0057651

(51) Int. Cl.
*H10P 72/00* (2026.01)
*H10P 70/00* (2026.01)

(52) U.S. Cl.
CPC .......... *H10P 72/0408* (2026.01); *H10P 70/80* (2026.01)

(58) Field of Classification Search
CPC ......... H01L 21/67034; H01L 21/02101; H01L 21/67017; H01L 21/67253; G03F 7/40; G03F 7/20; G03F 7/30; G03F 7/70; G03F 7/70691; G03F 7/70858; G03F 9/7057; G05D 7/0652
See application file for complete search history.

(56) References Cited

U.S. PATENT DOCUMENTS 5,972,799 A * 10/1999 Koshiishi .......... H01L 21/76802 438/743
11,322,370 B1 * 5/2022 Itatani ............... H01L 21/67017
2018/0012755 A1 * 1/2018 Lee ......................... F26B 21/10
2019/0080888 A1 * 3/2019 Ikenaga ............ H01J 37/32724
(Continued)

FOREIGN PATENT DOCUMENTS

JP 2004-228487 8/2004
JP 2012-084656 4/2012
KR 10-1998-0070319 10/1998
(Continued)

OTHER PUBLICATIONS

Office Action dated Dec. 8, 2023 for Korean Patent Application No. 10-2022-0057651 and its English translation from Global Dossier.
(Continued)

*Primary Examiner* — David J Laux
(74) *Attorney, Agent, or Firm* — WOMBLE BOND DICKINSON (US) LLP

(57) ABSTRACT

Provided is an apparatus for supplying gas in a facility for processing a substrate, the apparatus for supplying gas in a facility for processing a substrate including: a gas supply line connecting a gas storage unit and a process chamber for processing a substrate; and a flow control unit installed in the gas supply line, and controlling a gas flow rate of drying gas supplied through the gas supply line with a metering valve and a mass flow controller (MFC) disposed in parallel.

9 Claims, 12 Drawing Sheets

(56) References Cited

U.S. PATENT DOCUMENTS

| | | | | |
|---|---|---|---|---|
| 2021/0050210 | A1 | 2/2021 | Seo et al. | |
| 2023/0131222 | A1* | 4/2023 | Choi | H01L 21/67034 137/12 |

FOREIGN PATENT DOCUMENTS

| | | |
|---|---|---|
| KR | 10-2004-0059475 | 7/2004 |
| KR | 10-2006-0080071 | 7/2006 |
| KR | 10-2018-0006716 | 1/2018 |
| KR | 10-2020-0139378 | 12/2020 |
| KR | 10-2023-0059369 | 5/2023 |

OTHER PUBLICATIONS

Office Action dated Aug. 26, 2026 for Taiwnese Patent Application No. 112114448 and its English translation by Google Translate.

* cited by examiner

APPARATUS AND METHOD FOR SUPPLYING GAS, FACILITY FOR PROCESSING SUBSTRATE

CROSS-REFERENCE TO RELATED APPLICATION(S)

This application claims the benefit under 35 USC 119(a) of Korean Patent Application No. 10-2022-0057651 filed on May 11, 2022 in the Korean Intellectual Property Office, the entire disclosure of which is incorporated herein by reference for all purposes.

BACKGROUND

The present disclosure relates to an apparatus and a method for supplying gas for drying a substrate with drying gas, and a facility for processing a substrate.

In case of drying a developing solution applied to a substrate, the substrate may be disposed on a spin head and the spin head may be rotated to dry the developing solution on the substrate. However, this method may cause problems such as photoresist (PR) collapse, leaning, bridging, lifting, and the like.

Recently, a method of substituting and drying a developing solution on a substrate using a supercritical drying gas, for example, supercritical carbon dioxide, has been utilized to improve the above-described problems. In this case, a high-pressure drying gas supply device may be used, and in the conventional drying gas supply device, local annular and condensation cluster defects, and the like, which occur due to substrate drying failure, are expressed.

(Patent Document 1) Republic of Korea Patent Publication No. 10-2020-0139378

SUMMARY

The present disclosure has been devised to solve the above problems, and an aspect of the present disclosure is to provide an apparatus and a method for supplying gas for preventing the occurrence of cluster defects on a substrate, and a facility for processing a substrate.

According to an aspect of the present disclosure, an apparatus for supplying gas in a facility for processing a substrate, includes: a gas supply line connecting a gas storage unit and a process chamber for processing a substrate; and a flow control unit installed in the gas supply line, and controlling a gas flow rate of drying gas supplied through the gas supply line through a metering valve and a mass flow controller (MFC), disposed in parallel.

Here, the gas supply line may include a plurality of branch lines disposed in parallel, wherein the flow control unit may include: a first control unit having a first on-off valve and the mass flow controller; and a second control unit having a second on-off valve and the metering valve, wherein the first control unit and the second control unit may be installed on different branch lines among the plurality of branch lines.

In this case, the mass flow controller may control a flow rate of the drying gas within a relatively low flow rate range, as compared to that of the metering valve.

The second control unit may be provided in plural, and the plurality of second control units may be respectively installed on different branch lines, among the plurality of branch lines.

Here, the plurality of metering valves of the plurality of second control units may be set to have different opening rates, respectively.

The plurality of metering valves of the plurality of second control units may be set to sequentially increase opening rates.

The first control unit may be provided in plural, and the plurality of first control units may be respectively installed on different branch lines among the plurality of branch lines.

Here, the plurality of mass flow controllers of the plurality of first control units may control the flow rate of the drying gas within different flow rate ranges, respectively.

In this case, the plurality of mass flow controllers of the plurality of first control units may sequentially increase the flow rate range for controlling the drying gas.

In the first control unit, a flow restrictor may be installed between the first on-off valve and the mass flow controller.

The flow restrictor may be at least one of an orifice, a mesh member, and a porous member.

The drying gas may be a supercritical fluid.

According to an aspect of the present disclosure, a facility for processing a substrate may be provided, the facility for processing a substrate including: a gas storage unit, storing gas; a process chamber for drying a substrate; a gas supply line connecting the gas storage unit and the process chamber; a gas discharge line connected to the process chamber; and a flow control unit installed in the gas supply line, and controlling a gas flow rate of drying gas suppled through the gas supply line with a metering valve and a mass flow controller (MFC), disposed in parallel, wherein the gas supply line includes a plurality of branch lines disposed in parallel, wherein the flow control unit, a second control unit having a second on-off valve and the metering valve; and a first control unit having a first on-off valve and the mass flow controller, wherein the second control unit and the first control unit are installed on different branch lines in the plurality of branch lines.

According to an aspect of the present disclosure, a method for supplying gas in a facility for processing a substrate may be provided, the method including: a first gas supply operation of supplying drying gas from a gas storage unit to a process chamber while controlling a flow rate of the drying gas through a mass flow controller (MFC); and a second gas supply operation of supplying the drying gas from the gas storage unit to the process chamber while the flow rate of the drying gas is controlled through a metering valve, wherein the first gas supply operation and the second gas supply operation are sequentially performed to control the flow rate of the drying gas.

In this case, in the second gas supply operation, the flow rate of the drying gas may be sequentially controlled through the plurality of metering valves, disposed in parallel.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
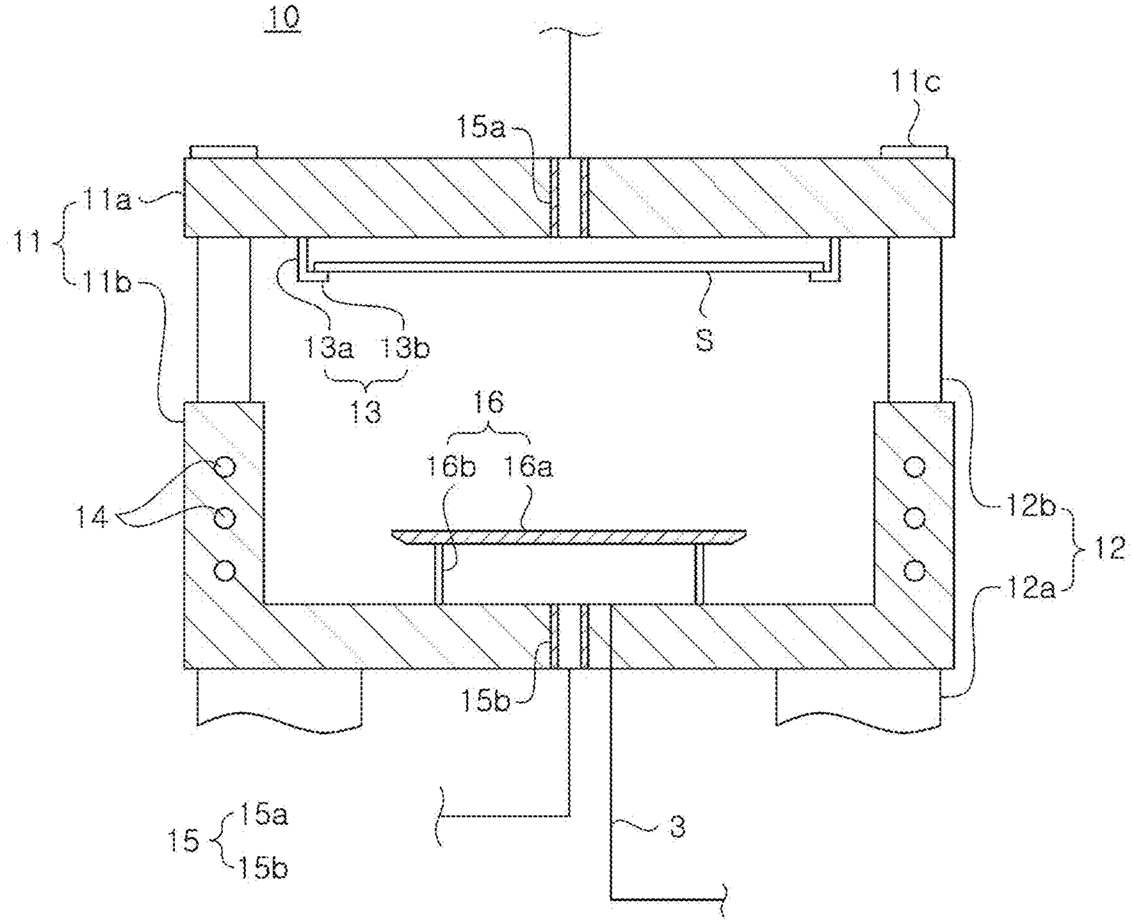
FIG. 1 is a view illustrating a process chamber for drying a substrate.

Hereinafter, preferred embodiments of the present disclosure will be described in detail so that those skilled in the art can easily practice the present disclosure with reference to the accompanying drawings. However, in describing a preferred embodiment of the present disclosure in detail, if it is determined that a detailed description of a related known function or configuration may unnecessarily obscure the subject matter of the present disclosure, the detailed description will be omitted. In addition, the same reference numerals are used throughout the drawings for parts having similar functions and actions. In addition, in the present specification, terms such as 'upper', 'upper portion', 'upper surface', 'lower', 'lower portion', 'lower surface', 'side surface', and the like are based on the drawings, and in practice, it may be different depending on a direction in which the components are placed.

In addition, throughout the specification, when a part is said to be 'connected' to another part, this is not only when it is 'directly connected', but also when it is 'indirectly connected' with other components therebetween. In addition, 'including' a certain component means that other components may be further included without excluding other components unless otherwise stated.

FIG. 1 is a view illustrating a process chamber for drying a substrate.

After etching and cleaning a substrate, the substrate is dried by rotating the substrate. However, in this case, a phenomenon in which a pattern formed on the substrate collapses (falls down or collapses) by rotational force may occur. Accordingly, the substrate may be moved to a subsequent process chamber (vessel) and dried with drying gas without rotating the substrate.

Referring to FIG. 1, in a process chamber 10 for drying a substrate S, the substrate S may be dried using a supercritical fluid as drying gas. Carbon dioxide ($CO_2$) may be used as an example of the supercritical fluid. The substrate S may be supercritically dried by carbon dioxide at a critical temperature (31° C.) and a critical pressure (73.8 bars) or higher.

The process chamber 10 may include a housing 11, a lifting unit 12, a support unit 13, a heating member 14, a fluid supply unit 15, and a blocking member 16.

The housing 11 provides a processing space in which a supercritical drying process is performed. The housing 11 may be formed of a material capable of withstanding a high pressure, equal to or higher than a critical pressure. The housing 11 includes an upper module 11*a* and a lower module 11*b*. The lower module 11*b* is coupled to the upper module 11*a* below the upper module 11*a*. A space created by a combination of the upper module 11*a* and the lower module 11*b* serves as a processing space for performing a substrate processing process. The upper module 11*a* is fixedly installed in an external structure. The lower module 11*b* is provided so as to be liftable, relative to the upper module 11*a*. When the lower module 11*b* is lowered and is separated from the upper module 11*a*, a processing space inside the process chamber 10 is opened. The substrate S may be inserted into or removed from the processing space of the process chamber 10. The substrate S, inserted into the process chamber 10 may be in a state in which a substrate cleaning liquid (e.g., Iso-Propyl Alcohol (IPA) remains. When the lower module 11*b* is raised and adheres to the upper module 11*a*, a processing space inside the process chamber 10 is sealed. In the sealed processing space, the substrate may be processed using supercritical fluid. Unlike the above-described example, the housing 11 may have a structure in which the lower module 11*b* is fixedly installed and the upper module 11*a* is lifted.

The lifting unit 12 lifts the lower module 11*b*. The lifting unit 12 includes a lifting cylinder 12*a* and a lifting rod 12*b*. The lifting cylinder 12*a* is coupled to the lower module 11*b*, to generate driving force in a vertical direction. While substrate processing using supercritical fluid is performed, the lifting cylinder 12*a* generates driving force, sufficient to overcome high pressure, equal to or higher than a critical pressure inside the process chamber 10, and to adhere the upper module 11*a* and the lower module 11*b* to seal the process chamber 10. The lifting rod 12*b* has one end thereof inserted into the lifting cylinder 12*a* and extending vertically upwardly, and the other end thereof coupled to the upper module 11*a*. When driving force is generated in the lifting cylinder 12*a*, the lifting cylinder 12*a* and the lifting rod 12*b* may be relatively lifted so that the lower module 11*b* coupled to the lifting cylinder 12*a* may be lifted. While the lower module 11*b* is lifted by the lifting cylinder 12*a*, the lifting rod 12*b* prevents the upper module 11*a* and the lower module 11*b* from moving in a horizontal direction and guides a lifting direction, to prevent the upper module 11*a* and the lower module 11*b* from being separated from their respective positions from each other.

The support unit 13 is located in a processing space of the housing 11 and supports the substrate S. The support unit 13 is coupled to the upper module 11*a*. The support unit 13 includes a vertical portion 13*a* and a horizontal portion 13*b*. The vertical portion 13*a* extends downwardly from an upper wall of the housing 11 and is provided. The vertical portion 13*a* is installed on a lower surface of the upper module 11*a*. The vertical portion 13*a* extends downwardly from the upper module 11*a* and is provided. An end of the vertical portion 13*a* is vertically coupled to the horizontal portion 13*b*. The horizontal portion 13*b* extends from the end of the vertical portion 13*a* inwardly of the housing 11 and is provided. A substrate S is disposed on the horizontal portion 13*b*. The horizontal portion 13*b* supports a bottom surface of an edge region of the substrate S. The support unit 13 is in contact with the edge region of the substrate S and supports the substrate S, so that substrate processing through a supercritical fluid may be performed on an entire region of the upper surface and most regions of the lower surface of the substrate S. Here, the substrate S may have a patterned upper surface and a non-patterned lower surface. The support unit 13 is installed on the upper module 11*a*. The support unit 13 may relatively stably support the substrate S while the lower module 11*b* is lifted. A horizontal adjustment member 11*c* is installed in the upper module 11*a* in which the support unit 13 is installed. The horizontal adjustment member 11*c* adjusts a degree of horizontality of the upper module 11*a*. The degree of horizontality of the upper module 11*a* is adjusted, and the horizontality of the substrate S seated on the support unit 13 installed on the upper module 11*a* is adjusted. When the upper module 11*a* is lifted and the lower module 11*b* is fixedly installed, or when the support unit 13 is installed on the lower module 11*b*, the horizontal adjustment member 11*c* may also be installed on the lower module 11*b*.

The heating member 14 heats an inside of the process chamber 10. The heating member 14 heats a supercritical fluid supplied into the process chamber 10 to a critical temperature or higher and maintains the supercritical fluid phase. When the supercritical fluid is liquefied, the heating member 14 may heat the supercritical fluid to become a supercritical fluid again. The heating member 14 is installed by being embedded in at least one wall of the upper module 11*a* and the lower module 11*b*. The heating member 14 generates heat by receiving power from the outside. The heating member 14 may be provided as, for example, a heater.

The fluid supply unit 15 supplies fluid to the process chamber 10. The supplied fluid may be a supercritical fluid. For example, the supplied supercritical fluid may be carbon dioxide (CO2). The fluid supply unit 15 includes an upper fluid supply unit 15*a*, a lower fluid supply unit 15*b* and a gas supply line 1. The upper fluid supply unit 15*a* supplies supercritical fluid directly to an upper surface of the substrate S. The upper fluid supply unit 15*a* is provided while connected to the upper module 11*a*. The upper fluid supply unit 15*a* is provided while connected to the upper module 11*a* facing a central upper surface of the substrate S. The lower fluid supply unit 15*b* supplies supercritical fluid to a lower surface of the substrate S. The lower fluid supply unit 15*b* is provided while connected to the lower module 11*b*. The lower fluid supply unit 15*b* is provided while connected to the lower module 11*b* facing a central lower surface of the substrate S. The supercritical fluid injected from the upper fluid supply unit 15*a* and the lower fluid supply unit 15*b* reaches a central region of the substrate S and spreads to an edge region to be uniformly provided to an entire region of the substrate S. The gas supply line 1 is connected to the upper fluid supply unit 15*a* and the lower fluid supply unit 15*b*. The gas supply line 1 receives supercritical fluid from a gas reservoir (GR in FIG. 2) provided separately to the outside, and supplies the supercritical fluid to the upper fluid supply unit 15*a* and the lower fluid supply unit 15*b*. In addition, a gas discharge line 3 is installed below the process chamber 10. The fluid supply unit 15 may first supply supercritical fluid from the lower fluid supply unit 15*b*. Then, the upper fluid supply unit 15*a* may supply supercritical fluid. A supercritical drying process may initially proceed in a state in which an inside of the process chamber 10 does not reach critical pressure. When the inside of the process chamber 10 is below the critical pressure, the supercritical fluid supplied thereinto may be liquefied. When the supercritical fluid is liquefied, it may fall to the substrate S by gravity and damage the substrate S. Therefore, the supercritical fluid is first supplied from the lower fluid supply unit 15*b*. After the supercritical fluid is supplied to the process chamber 10, the internal pressure reaches the critical pressure. After the internal pressure of the process chamber 10 reaches the critical pressure, supercritical fluid is supplied from the upper fluid supply unit 15*a*. It is possible to prevent the supercritical fluid from being liquefied and falling to the substrate S by supplying the supercritical fluid from the lower fluid supply unit 15*b* before the upper fluid supply unit 15*a*.

The blocking member 16 prevents the supercritical fluid supplied from the fluid supply unit 15 from being directly sprayed onto a lower surface of the substrate S. The blocking member 16 includes a blocking plate 16*a* and a support 16*b*. The blocking plate 16*a* is located inside the housing 11, that is, in the processing space. The blocking plate 16*a* is disposed between the support unit 13 and the lower fluid supply unit 15*b*. The blocking plate 16*a* is provided in a shape corresponding to the substrate S. For example, the blocking plate 16*a* may be provided in a circular plate shape. A radius of the blocking plate 16*a* may be provided similarly to or greater than that of the substrate S. The blocking plate 16*a* is supported by a support 16*b*. The blocking plate 16*a* is located on a lower surface of the substrate S disposed on the support unit 13 to prevent the supercritical fluid supplied through the lower fluid supply unit 15*b* from being directly sprayed onto the lower surface of the substrate S. When the radius of the blocking plate 16*a* is provided to be similar to or greater than that of the substrate S, it is possible to completely block the supercritical fluid from being directly sprayed onto the substrate S. Alternatively, a diameter of the blocking plate 16*a* may be smaller than that of the substrate S. In this case, direct spraying of the supercritical fluid to the substrate S is blocked. In addition, by reducing a flow rate of the supercritical fluid to a minimum, the supercritical fluid may relatively easily reach the substrate S. When the radius of the blocking plate 16*a* is smaller than that of the substrate S, a supercritical drying process of the substrate S may be effectively performed.

Figure 2:
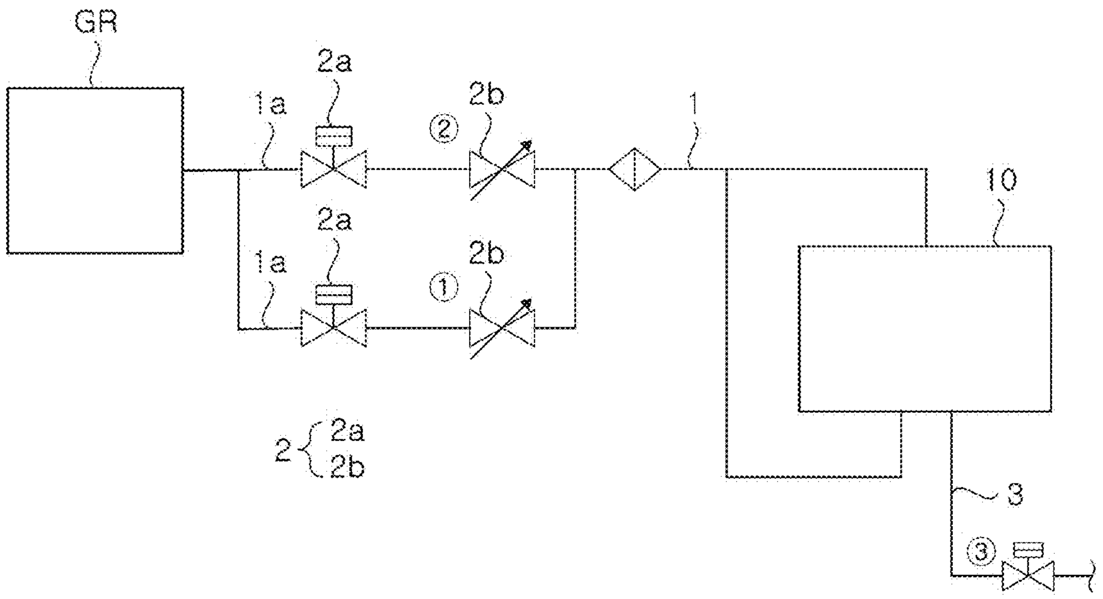
FIG. 2 is a view illustrating an apparatus for supplying gas according to the prior art connected to a process chamber.

FIG. 2 is a view illustrating an apparatus for supplying gas according to the prior art connected to the process chamber.

Referring to FIG. 2, a gas supply device according to the prior art includes a gas supply line 1 connecting a process chamber 10 and a gas storage unit GR, and a flow control unit 2 installed in the gas supply line 1.

The flow control unit 2 includes an on-off valve 2*a* and a metering valve 2*b*. As a flow rate of the drying gas is simply controlled using only the metering valve 2*b*, in the flow control unit 2, the flow rate of the drying gas is rapidly changed in an initial stage of supplying the drying gas. Specifically, the metering valve 2*b* is a valve that is set to a certain degree of opening rate to control a flow rate of gas. When controlling the flow rate of the drying gas using the metering valve 2*b*, the drying gas is controlled at a fixed flow rate. In the flow control unit 2, two metering valves 2*b* may be arranged in parallel on two branch lines 1*a* formed in the gas supply line 1. The two metering valves 2*b* are set at different opening rates. As an example, the lower metering valve 2*b* in the drawing is set to a relatively small opening rate, and the upper metering valve 2*b* is set to a relatively large opening rate. In the flow control unit, the drying gas is sequentially controlled to pass from the lower metering valve 2*b* through the upper metering valve 2*b*. In this case, the on-off valves 2 are opened one by one from the bottom and the others thereof are closed.

In this flow rate control method, a supply of the flow rate step by step is simply controlled at a fixed flow rate without metering change (flow rate change), but a flow rate and pressure of the drying gas rapidly changes at the initial stage of supplying gas (when controlling the flow rate through the metering valve 2*b* below), the flow rate and pressure of the drying gas change rapidly.

Figure 3:
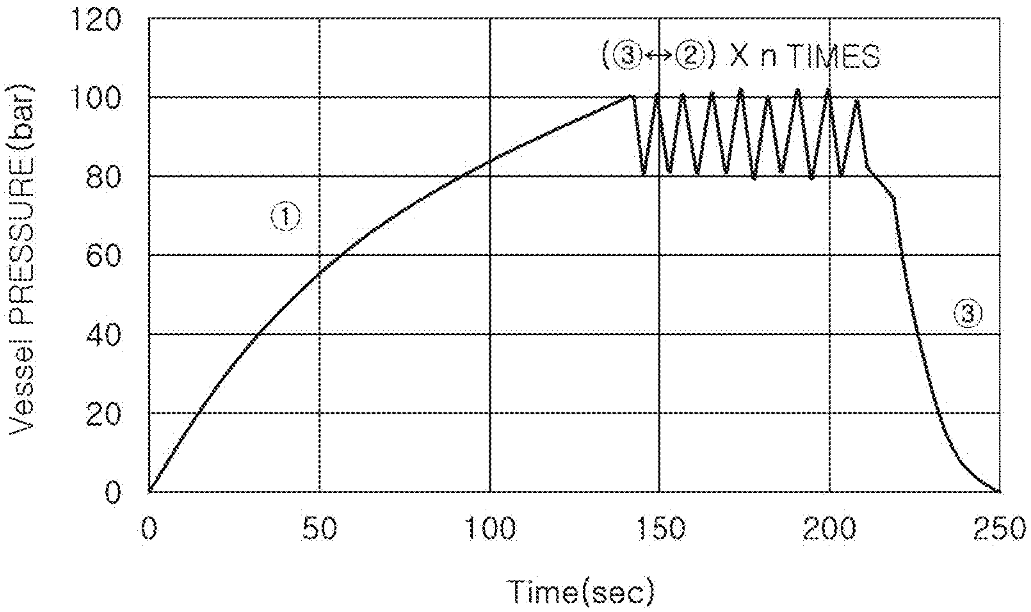
FIG. 3 is a graph illustrating internal pressure of the process chamber of FIG. 2 over time.

FIG. 3 is a graph illustrating internal pressure of the process chamber of the facility of processing a substrate of FIG. 2 over time.

Referring to FIGS. 2 and 3, in the prior art, as drying gas is controlled in a fixed flow rate by a metering valve 2*b*, internal pressure of the process chamber 10 rapidly rises at an initial stage of supplying gas. That is, as illustrated in the drawing, a logarithmic (Log) function type pressure curve appears. Specifically, from the initial stage of supplying drying gas, drying gas is supplied through ① a metering valve 2*b* below (an on-off valve 2*a* in front of ① the metering valve 2*b* is opened), and then when the process chamber 10 rises to 100 bars, supercritical pressure, the drying gas is repeatedly discharged and supplied in consideration of the pressure stability of the process chamber 10. That is, ③ an on-off valve of a gas discharge line 3 is opened (the on-off valve 2*a* in front of D the metering valve is closed) to temporarily discharge the drying gas to lower the internal pressure of the process chamber to a certain extent, and as the drying gas is supplied again through ② the metering valve 2*b* (the on-off valve ③ is closed and the on-off valve 2*a* in front of the ② metering valve 2*b* is opened), the drying gas is repeatedly discharged and supplied. In other words, as illustrated in the graph of FIG. 3, if the valves through which the drying gas passes are indicated only by numbers, the drying gas is supplied through a process such as ①→(③↔②)×n times.

Figure 4:
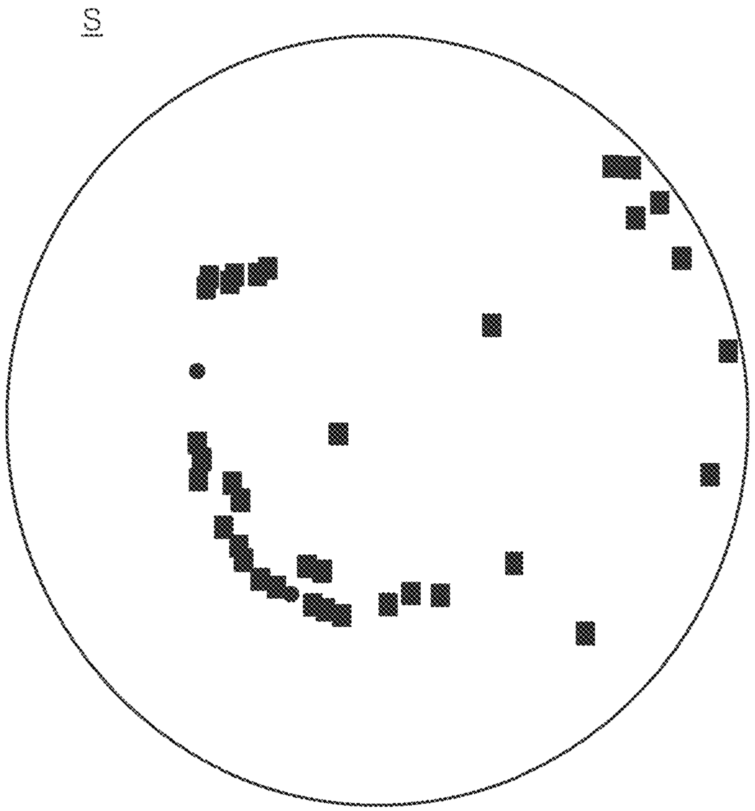
FIG. 4 is a view illustrating a state of a substrate, dried and processed in the facility for processing a substrate of FIG. 2.

FIG. 4 is a view illustrating a state of a substrate dried and processed in the facility for processing a substrate of FIG. 2.

When drying gas is initially supplied to the substrate, the flow rate and pressure of the drying gas rapidly change, resulting in large inertial force on a surface of the substrate, resulting in damage. That is, as an amount of increase in drying gas changes rapidly changed, a developing solution or cleaning solution on the surface of the substrate is rapidly pushed from a center to an edge thereof, resulting in an annular cluster defect on the surface of the substrate S as illustrated in the drawing.

The number of metering valves may be infinitely increased to mitigate the change in the increase amount of drying gas, but there are inefficient limitations in terms of productivity in terms of an installation space, maintenance, costs, and the like.

Figure 5:
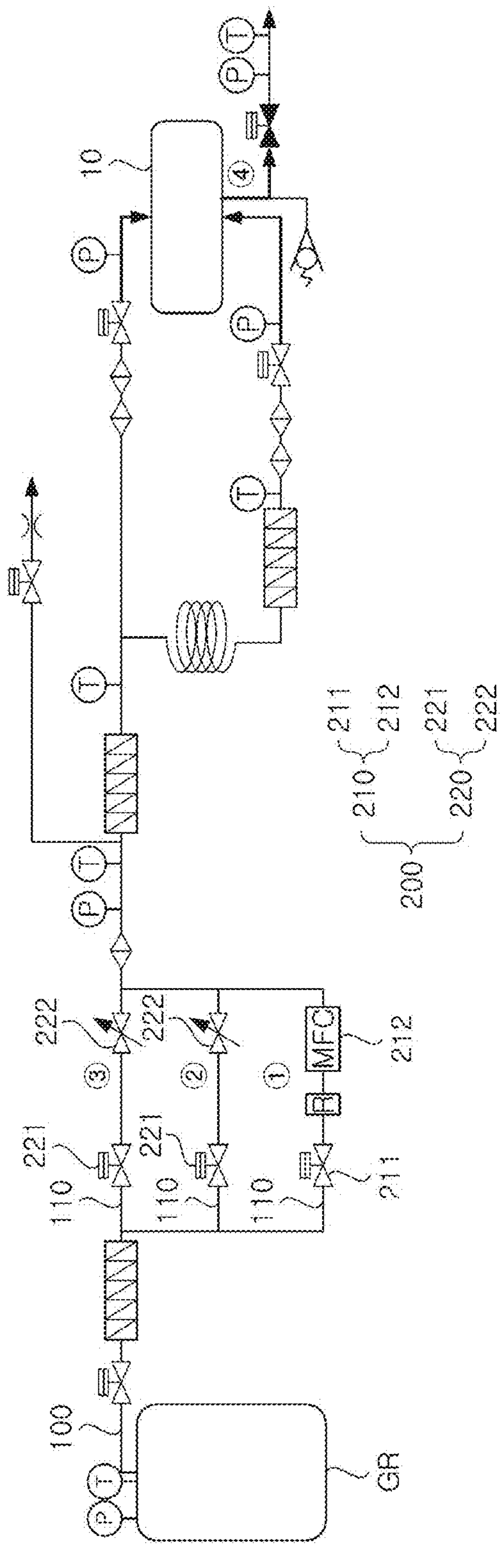
FIG. 5 is a view illustrating a facility for processing a substrate in which an apparatus for supplying gas according to a first embodiment of the present disclosure is installed.
Figure 6:
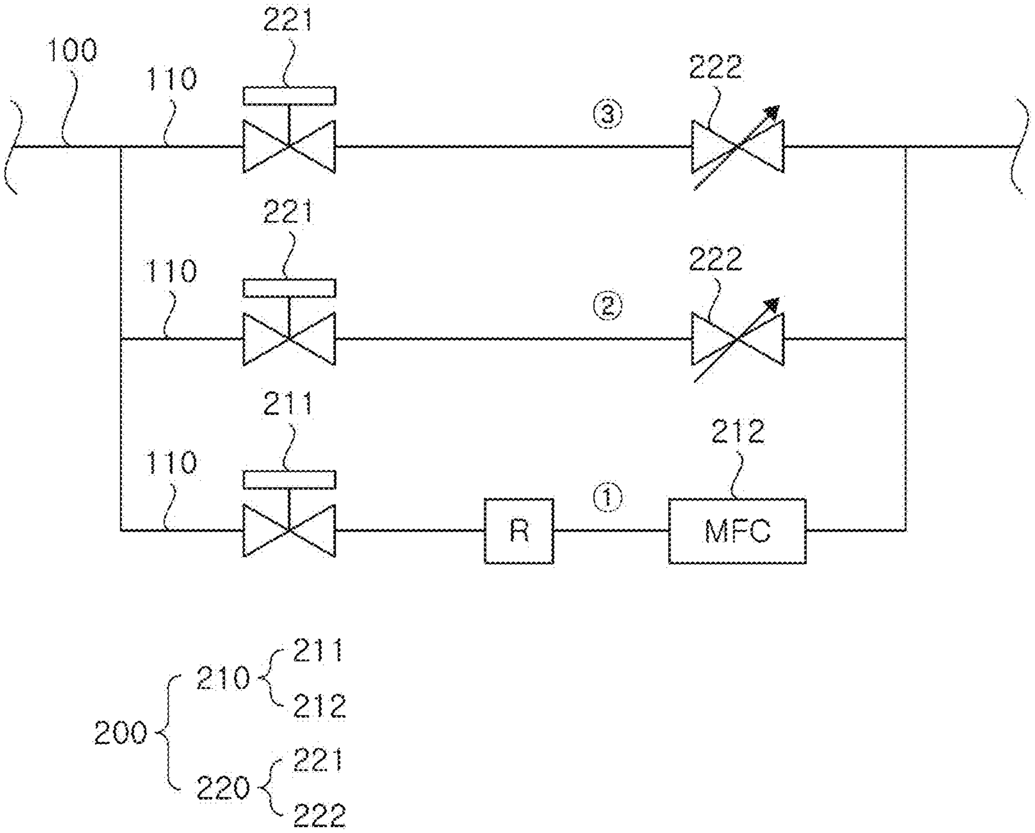
FIG. 6 is an enlarged view illustrating the apparatus for supplying gas of FIG. 5.

FIG. 5 is a view illustrating a facility for processing a substrate in which an apparatus for supplying gas according to a first embodiment of the present disclosure is installed, and FIG. 6 is an enlarged view illustrating the apparatus for supplying gas of FIG. 5.

Referring to FIGS. 5 and 6, the present disclosure includes a gas storage unit GR, a process chamber 10, a gas supply line 100, a gas discharge line, and a flow control unit 200.

The gas storage unit GR is configured to store gas, and the process chamber 10 is configured to dry a substrate. A specific structure of the gas storage unit GR and the process chamber 10 are not limited by the present disclosure.

The gas supply line 100 connects the process chamber 10 and the gas storage unit GR. For reference, the symbol P illustrated in the drawing is a pressure gauge, and the symbol T is a thermometer.

The flow control unit 200 is installed in the gas supply line 100, and controls a gas flow rate of drying gas supplied through the gas supply line 100. The flow control unit 200 controls the gas flow rate of the drying gas with a metering valve 222 and the mass flow controller (MFC) 212, disposed in parallel. Specifically, the gas supply line 100 includes a plurality of branch lines 110 disposed in parallel. Here, the flow control unit 200 includes a first control unit 210 and a second control unit 220. The first control unit 210 and the second control unit 220 are installed on different branch lines 110 in a plurality of branch lines 110.

The first control unit 210 has a first on-off valve 211 and a mass flow controller 212. When the first on-off valve 211 is opened, drying gas flows in the branch line 110 in which the first control unit 210 is installed, and when the first on-off valve 211 is closed, drying gas does not flow in the branch line 110 in which the first control unit 210 is installed. In addition, the mass flow controller (MFC) 212 is a device used to measure and control a flow rate of a fluid. The mass flow controller 212 measures and controls a mass flow rate of gas, not a volume flow rate that changes according to a temperature and pressure of the gas. That is, the mass flow controller 212 automatically controls the flow rate of the gas according to a set flow rate transmitted as an electrical signal without being affected by use conditions or a change in gas pressure. The mass flow controller 212 does not control the drying gas at a fixed flow rate set like the metering valve 222, but controls the flow rate to be gradually changed over time. Therefore, the mass flow controller 212 gradually changes an increase amount of drying gas over time without rapidly changing the increase amount thereof. However, the mass flow controller 212 may lack static pressure at high pressure. That is, the mass flow controller 212 controls the flow rate of the drying gas in a relatively low flow rate range, as compared to the metering valve 222 of the second control unit 220 because it can cause an unstable flow rate at high pressure. That is, the first control unit 210 including the mass flow controller 212 controls the flow rate of the drying gas at an initial stage of supplying the drying gas (low flow range), and accordingly, a change in the increase amount of the drying gas at the initial stage of supplying the drying gas to be performed gradually.

The second control unit 220 has a second on-off valve 221 and a metering valve 222. When the second on-off valve 221 is opened, drying gas flows in the branch line 110 in which the second control unit 220 is installed, and when the second on-off valve 221 is closed, the flow of drying gas is blocked in the branch line 110 in which the second control unit 220 is installed. The metering valve 222 is a valve that is used by manually or automatically setting an opening rate of the valve in advance, and controls the drying gas at a fixed flow rate. Since the metering valve 222 may maintain static pressure even at high pressure, the metering valve 222 controls the flow rate of the drying gas in a relatively high flow rate range, as compared to that of the mass flow controller 212 of the first control unit 210. That is, the second control unit 220 including the metering valve 222 controls the flow rate of the drying gas in a high flow rate range after the initial stage of supplying the drying gas.

A plurality of second control units 220 are disposed, and after the initial stage of supplying the drying gas, the flow rate of the drying gas is controlled by a multilevel fixed metering flow rate supply control method. Therefore, even after the initial stage of supplying the drying gas, a change in the supply increase of the drying gas is prevented from being performed rapidly. Specifically, the plurality of second control units 220 are respectively installed on different branch lines 110 among the plurality of branch lines 110. The plurality of metering valves 222 of the plurality of second control units 220 are set to have different opening rates. The plurality of metering valves 222 of the plurality of second control units 220 are set to sequentially increase their opening rates. Accordingly, the second control unit 220 gradually changes the amount of drying gas after the initial stage of supplying the drying gas.

Figure 7:
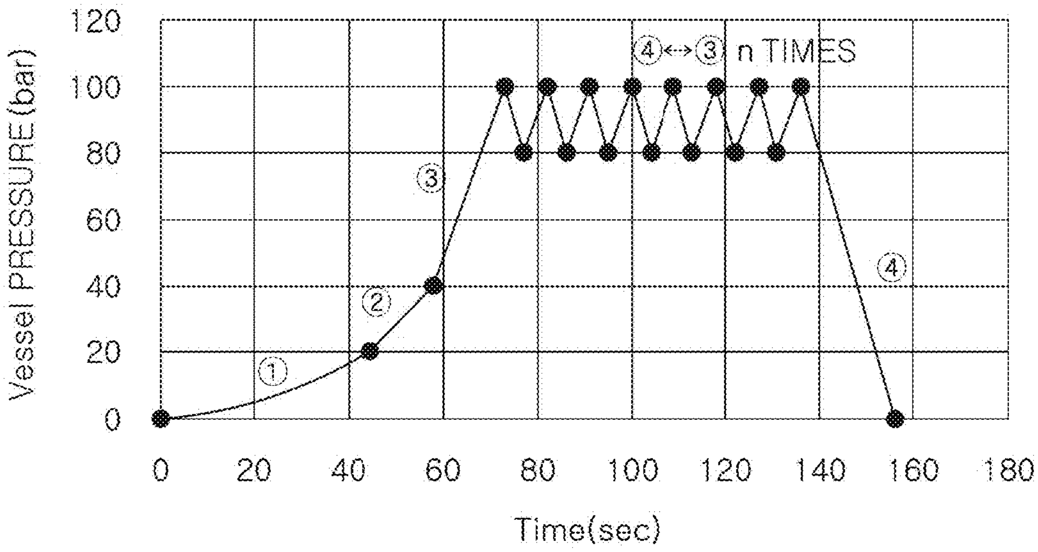
FIG. 7 is a graph illustrating the internal pressure of the process chamber of the facility for processing a substrate of FIG. 5 over time.

FIG. 7 is a graph illustrating internal pressure of the process chamber 10 of the facility for processing a substrate of FIG. 5 over time.

Referring to FIGS. 5 to 7, in the present disclosure, as the drying gas is controlled by a variable flow rate method by the mass flow controller 212, at an initial stage of supplying the drying gas, internal pressure of the process chamber 10 gradually rises at the initial stage of supplying gas. That is, as illustrated in the drawing, an exponential type pressure curve appears. Specifically, referring to FIG. 8, together with FIGS. 5 to 7, drying gas is supplied through a mass flow controller 212 at a bottom at an initial stage of supplying the gas. After the initial stage of supplying the gas, drying gas is supplied through ② a metering valve 222 (an on-off valve in front of ② the metering valve 222 is opened), and drying gas is sequentially supplied through ③ a metering valve 222 (the on-off valve is in front of ③ the metering valve 222 is opened). Thereafter, when the process chamber 10 rises to 100 bar, a supercritical pressure, the drying gas is repeatedly discharged and supplied in consideration of pressure stability of the process chamber 10. That is, by closing the on-off valve in front of the ③ metering valve 222 and opening an on-off valve ④ of a gas discharge line, the drying gas is temporarily discharged to lower the internal pressure of the process chamber 10 to a certain extent, and as the on-off valve closes again and drying gas is supplied through the ③ metering valve 222, the drying gas is repeatedly discharged and supplied. In other words, as illustrated in the graph, if the mass flow controller and valves through which the drying gas passes are indicated only by numbers, the drying gas is supplied through a process such as ①→②→③→(④↔③)×n times.

Figure 9:
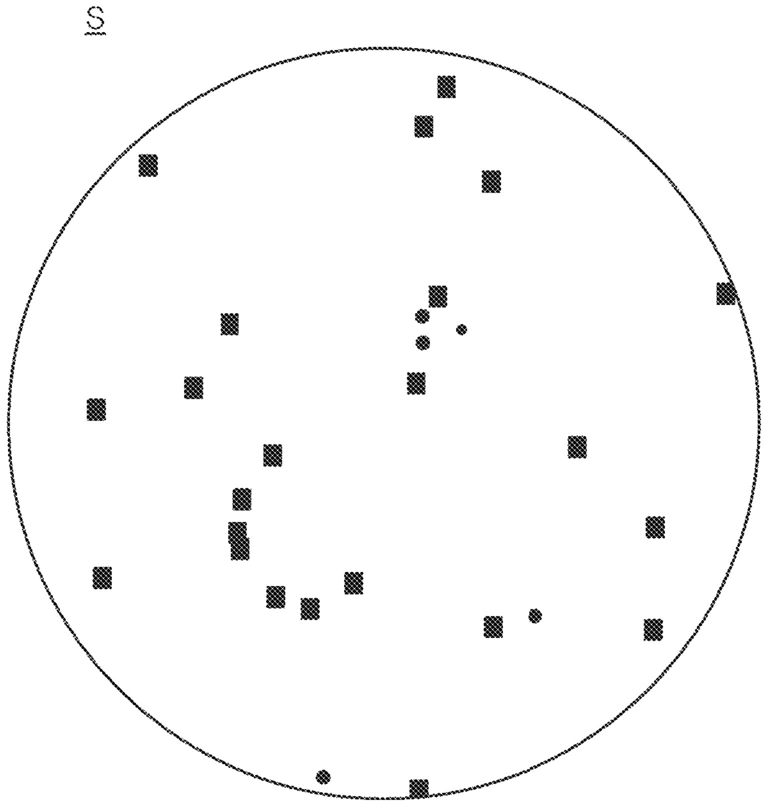
FIG. 9 is a view illustrating a state of a substrate dried and processed in the facility for processing a substrate of FIG. 5.

FIG. 9 is a view illustrating a state of a substrate dried and processed in the facility for processing a substrate of FIG. 5.

When drying gas is initially supplied to a substrate, a flow rate and pressure of the drying gas are not rapidly changed by the control of the mass flow controller (212 in FIGS. 5 and 6). As a result, as inertial force on a substrate of the substrate is not large, damage is not generated. That is, since a change in an increase amount of drying gas is gradually performed, rather than rapidly performed, the developing solution or cleaning solution on a surface of the substrate is gradually pushed from a center to a side of an edge thereof rather than rapidly pushed. Therefore, as illustrated in the drawing, foreign substances are not aggregated on the surface of the substrate S and are uniformly spread, so that processing defects of the substrate S do not occur. That is, occurrence of an annular cluster defect on a surface of the plate is prevented.

Furthermore, by controlling the supply flow rate of the drying gas through a plurality of metering valves (222 in FIGS. 5 and 6) after the initial stage of supplying the drying gas, it is possible to prevent a rapid change in the increase amount of the drying gas after the initial stage of supplying the drying gas. That is, processing defects of the substrate S may be prevented by a multilevel fixed metering flow rate supply control method in a high flow rate range.

Figure 10:
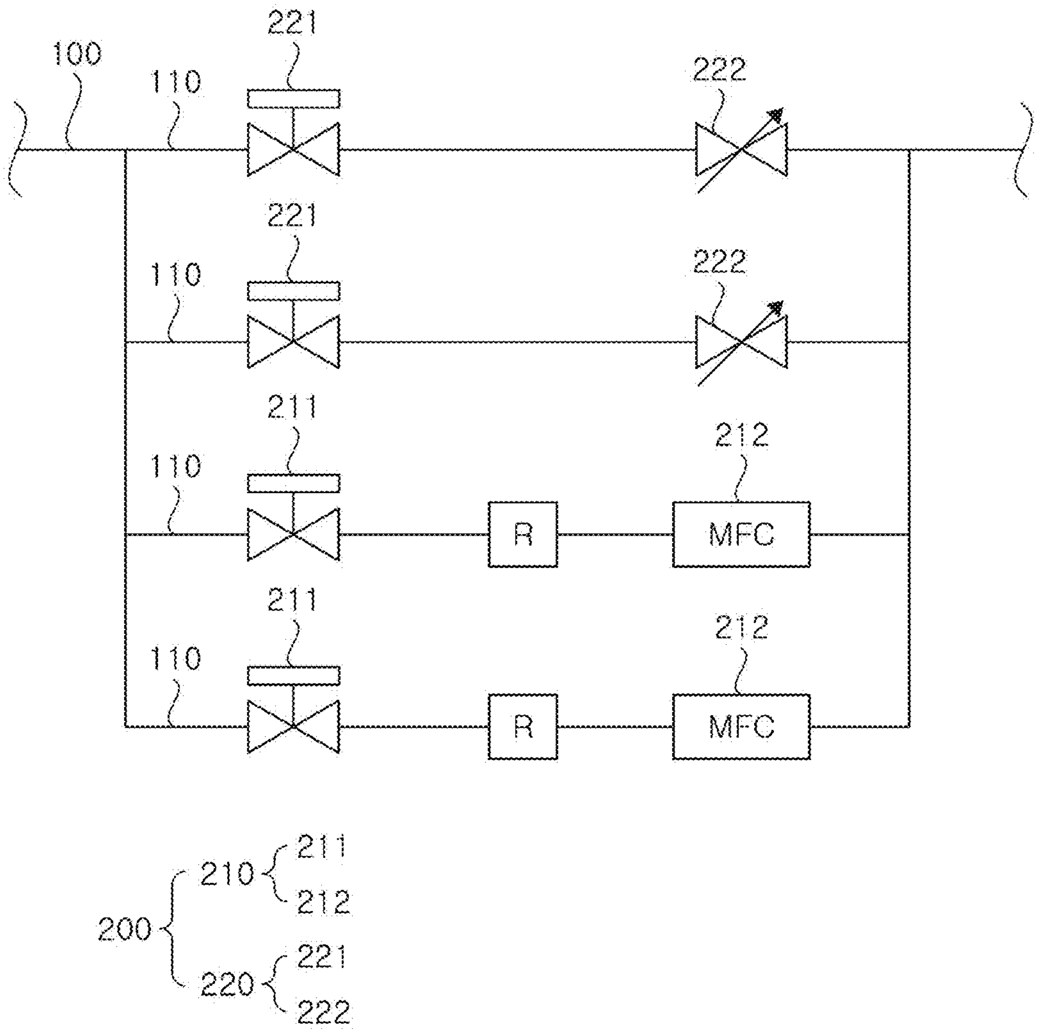
FIG. 10 is a view illustrating an apparatus for supplying gas according to a second embodiment of the present disclosure.

FIG. 10 is a view illustrating a facility for supplying gas according to a second embodiment of the present disclosure.

Referring to FIG. 10, a gas supply line 100 may have four branch lines 110 disposed in parallel disposed therein. In a flow control unit 200, a first control unit 210 may be respectively disposed in two lower branch lines 110, and a second control unit 220 may be respectively disposed in two upper branch lines 110. Each of the two first control units 210 has a first on-off valve 211 and a mass flow controller 212. In addition, each of the two second control units 220 has a second on-off valve 221 and a metering valve 222. The flow control unit 200 controls a supply flow rate of drying gas while being sequentially opened from the first on-off valve 211 at the bottom to the second on-off valve 221 on the top. In this case, only one of the on-off valves is opened and the others thereof are closed.

Here, the two different mass flow controllers 212 may control the flow rate of the drying gas within different flow rate ranges. In this case, the lower mass flow controller 212 controls the flow rate of the drying gas to be within a relatively low flow rate range, and the upper mass flow controller 212 controls the flow rate of the drying gas to be within a relatively high flow range. As a result, it is possible to gradually change an increase amount of drying gas by the two mass flow controllers 212 at the initial stage of supplying the drying gas.

In addition, the two different metering valves 222 may be set to have different opening rates. In this case, the lower metering valve 222 is set to have a relatively small opening rate, and the upper metering valve 222 thereabove is set to have a relatively large opening rate. By this multilevel fixed metering supply flow control method, it is possible to prevent a rapid change in the increase amount of the drying gas in the high flow rate range after the initial stage of supplying the drying gas.

Figure 11:
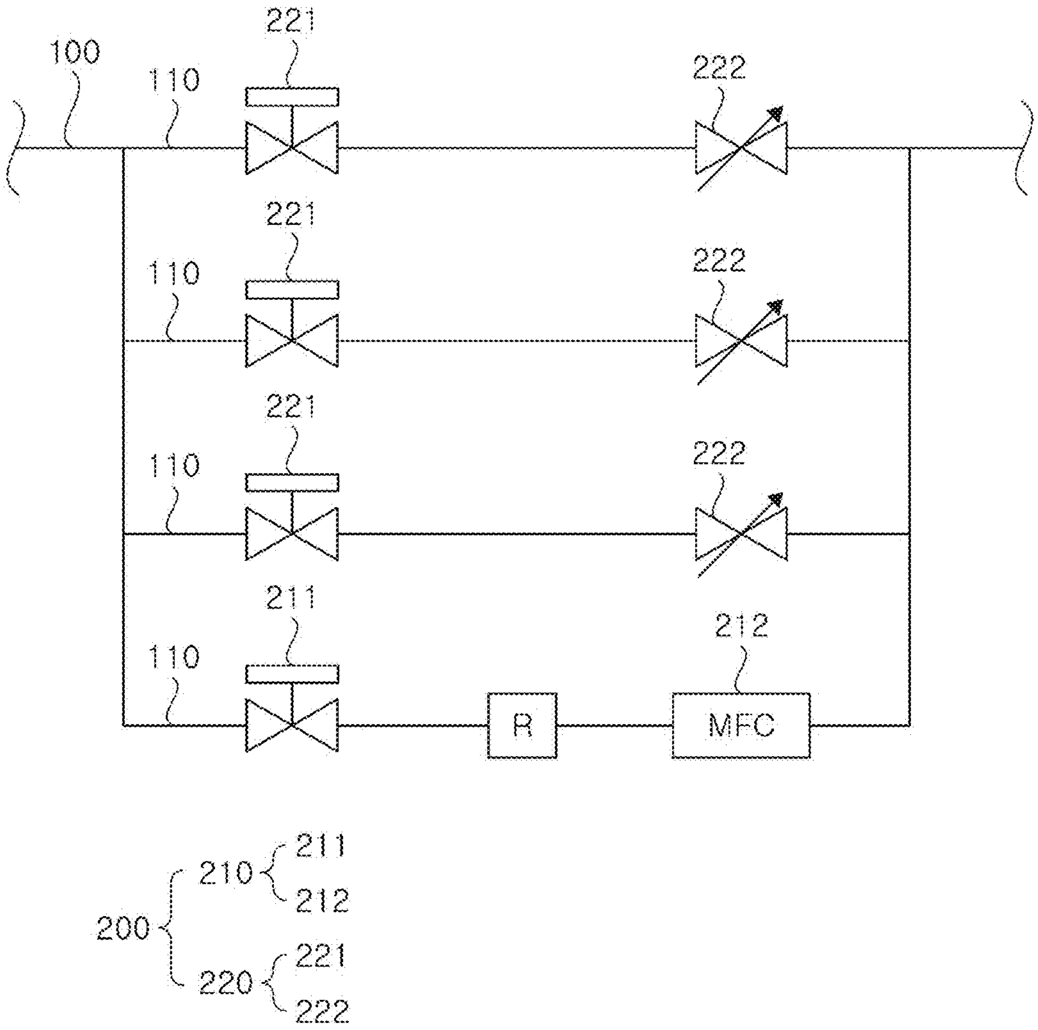
FIG. 11 is a view illustrating an apparatus for supplying gas according to a third embodiment of the present disclosure.

FIG. 11 is a view illustrating an apparatus for supplying gas according to a third embodiment of the present disclosure.

Referring to FIG. 11, the gas supply line 100 may have four branch lines 110*n* disposed in parallel. A first control unit 210 may be respectively disposed on one lower branch line 110, and a second control unit 220 may be respectively disposed on three upper branch lines 110. One first control unit 210 has one first on-off valve 211 and a mass flow controller 212. The three second control units 220 have three second on-off valves 221 and metering valves 222. The flow control unit 200 controls a supply flow rate of drying gas while sequentially being opened from the first on-off valve 211 at the bottom to the second on-off valve 221 on the top. In this case, only one of the on-off valves is opened and the others thereof are closed.

In this case, at an initial stage of supplying the drying gas, one mass flow controller 212 may gradually change the amount of drying gas.

In addition, the flow controllers of the three different metering valves 222 may be set to have different opening rates. In this case, it is set so that the opening increases sequentially from the metering valve 222 at the bottom to the metering valve 222 on the top. By this multilevel fixed metering supply flow control method, it is possible to prevent a rapid change in an increase amount of the drying gas in the high flow rate range after the initial stage of supplying the drying gas.

Figure 12:
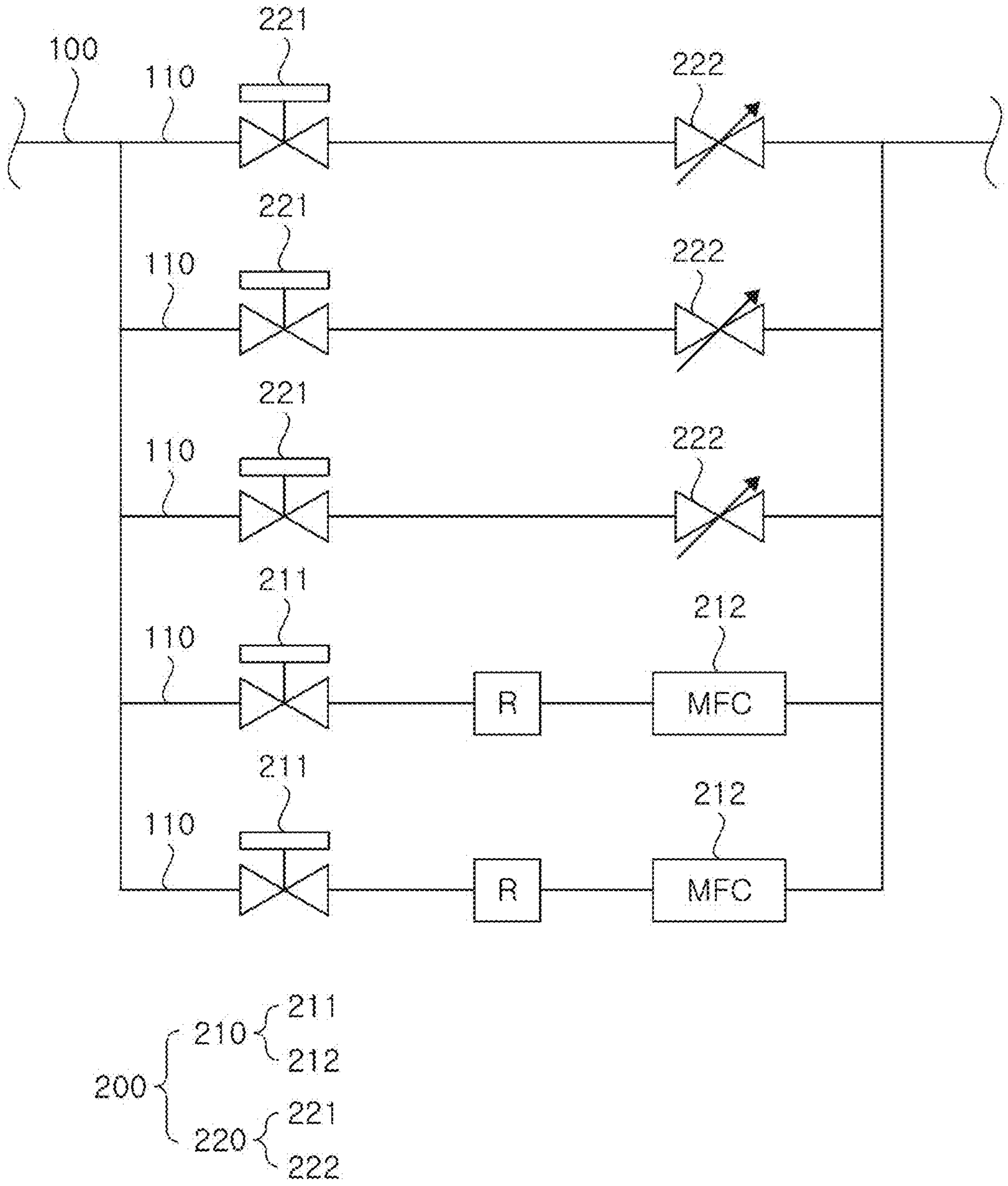
FIG. 12 is a view illustrating an apparatus for supplying gas according to a fourth embodiment of the present disclosure.

FIG. 12 is a view illustrating a facility for supplying gas according to a fourth embodiment of the present disclosure.

Referring to FIG. 12, a gas supply line 100 may include five branch lines 110 disposed in parallel. A first control unit 210 may be respectively disposed on two lower branch lines 110, and a second control unit 220 may be respectively disposed on three upper branch lines 110. The two first control units 210 have two first on-off valves 211 and mass flow controllers 212. The three second control units 220 have three second on-off valves 221 and metering valves 222. The flow control unit 200 controls a supply flow rate of the drying gas while sequentially being opened from the first on-off valve 211 at the bottom to the second on-off valve 221 on the top. In this case, only one of the on-off valves is opened and the others thereof are closed.

Here, the two different mass flow controllers 212 may control the flow rate of the drying gas within different flow rate ranges. In this case, the lower mass flow controller 212 controls the flow rate of the drying gas in a relatively small flow rate range, and the upper mass flow controller 212 controls the flow rate of the drying gas within a relatively large flow range. As a result, it is possible to gradually change an increase amount of drying gas by the two mass flow controllers 212 at the initial stage of supplying the drying gas.

In addition, the flow controllers of the three different metering valves 222 may be set to have different opening rates. In this case, it is set so that the opening rate increases sequentially from the metering valve 222 at the bottom toward the metering valve on the top. By this multilevel fixed metering supply flow control method, it is possible to prevent a rapid change in the increase amount of the drying gas in the high flow rate range after the initial stage of supplying the drying gas.

Meanwhile, in the present invention illustrated in FIGS. 5 and 10 to 12, the first control unit 210 may have a flow restrictor R between the first on-off valve 211 and the mass flow controller 212 installed therein. In this case, the flow restrictor R may be at least one of an orifice, a mesh member, and a porous member. Such a flow restrictor R may reduce a differential pressure applied to the mass flow controller 212 by the drying gas passing through the first on-off valve 211.

Figure 8:
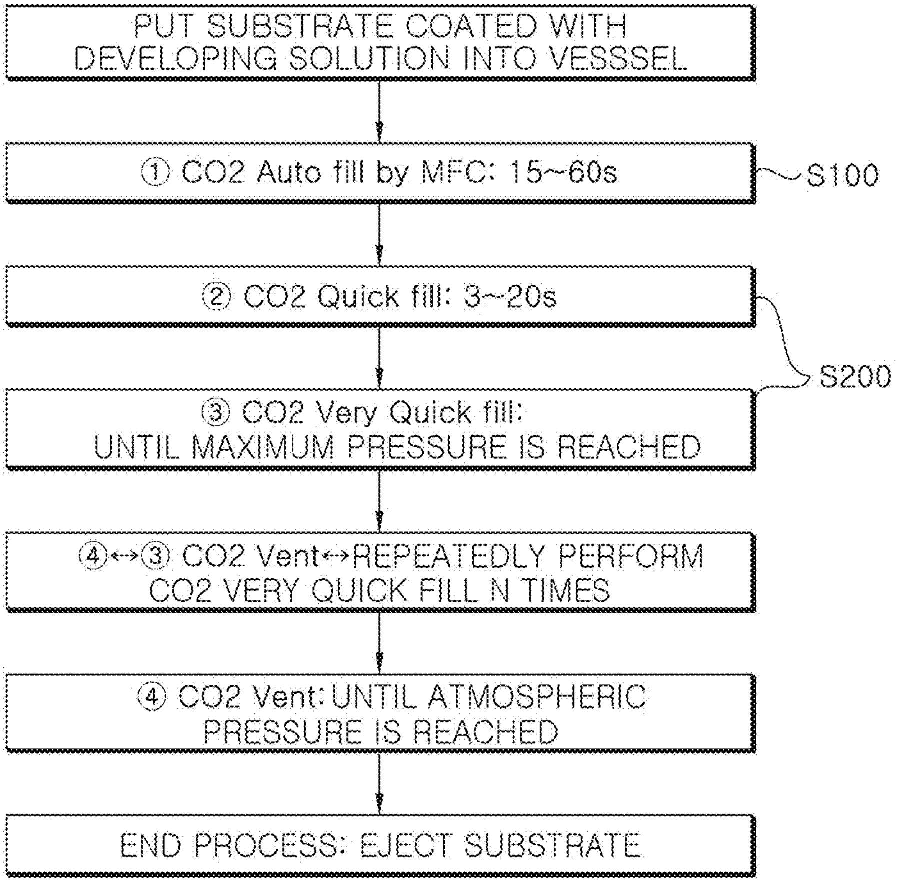
FIG. 8 is a flow chart illustrating a gas supply method causing a change in internal pressure of the process chamber of FIG. 7.

Meanwhile, a method for supplying gas in the facility for processing a substrate according to an embodiment of the present disclosure will be described with reference to FIG. 8 as follows.

The method for supplying gas according to the present disclosure includes a first gas supply operation S100 and a second gas supply operation S200. The first gas supply operation S100 and the second gas supply operation S200 may be sequentially performed to control a flow rate of drying gas.

First, the first gas supply operation S100 is an operation of supplying drying gas from a gas storage unit GR to a process chamber 10 while controlling a flow rate of the drying gas through a mass flow controller (MFC) 212. The mass flow controller 212 controls the flow rate of the drying gas when the drying gas is initially supplied, and accordingly, in the initial stage of supplying the drying gas, a change in an increase amount of the drying gas is gradually performed. As a result, a developing solution or a cleaning solution on a surface of the substrate is gradually pushed from a center to a side of an edge instead of being rapidly pushed, preventing annular cluster defects from occurring on the surface of the substrate.

Next, the second gas supply operation S200 is an operation of supplying drying gas from a gas storage unit GR to a process chamber 10 while controlling a flow rate of the drying gas is controlled through a metering valve 222. In the second gas supply operation S200, a plurality of metering valves 222 disposed in parallel may sequentially control the flow rate of the drying gas. By this multilevel fixed metering supply flow control method, it is possible to prevent a rapid change in an increase amount of the drying gas in a high flow rate range after the initial stage of supplying the drying gas.

As set forth above, according to the present disclosure, by controlling a flow rate of drying gas by a mass flow controller at an initial stage of supplying the drying gas, it is possible to gradually change an increase amount of the drying gas at the initial stage of supplying the drying gas.

Thereby, in the present disclosure, it is possible to prevent occurrence of annular condensation cluster defects on a surface of a plate, by allowing a developing solution or a cleaning solution on the surface of the substrate to be gradually pushed from a center to a side of an edge instead of being rapidly pushed.

While exemplary embodiments have been shown and described above, it will be apparent to those skilled in the art that modifications and variations could be made without departing from the scope of the present invention as defined by the appended claims.

DESCRIPTION OF REFERENCE NUMERALS

100: GAS SUPPLY LINE
110: BRANCH LINE
200: FLOW CONTROL UNIT
210: FIRST CONTROL UNIT
211: FIRST ON-OFF VALVE
212: MASS FLOW CONTROLLER
220: SECOND CONTROL UNIT
221: SECOND ON-OFF VALVE
222: METERING VALVE
300: GAS DISCHARGE LINE
S: SUBSTRATE
GR: GAS STORAGE UNIT
S100: FIRST GAS SUPPLY OPERATION
S200: SECOND GAS SUPPLY OPERATION

What is claimed is:

1. An apparatus for supplying gas in a facility for processing a substrate, the apparatus comprising:
- a gas supply line connecting a gas storage unit and a process chamber for processing a substrate; and
- a flow control unit installed in the gas supply line, and controlling a gas flow rate of drying gas supplied through the gas supply line through a metering valve and a mass flow controller, the metering valve and the mass flow controller being disposed in parallel and the drying gas being a supercritical fluid,
- wherein the gas supply line comprises a plurality of branch lines, disposed in parallel,
- wherein the flow control unit comprises,
  - a first control unit having a first on-off valve and the mass flow controller; and
  - a second control unit having a second on-off valve and the metering valve,
- wherein the first control unit and the second control unit are installed on different branch lines among the plurality of branch lines,
- wherein the mass flow controller controls a flow rate of the drying gas at a first flow rate range that is lower than a second flow rate range used by the metering valve to control the flow rate of the driving gas,
- wherein the second control unit is provided in plural, and the plurality of second control units are respectively installed on different branch lines among the plurality of branch lines,
- wherein the plurality of metering valves of the plurality of second control units are set to have different opening rates, respectively, and
- wherein the plurality of metering valves of the plurality of second control units are set to sequentially increase opening rates to control the flow rate of the drying gas using a multilevel fixed metering rate supply control method at the second flow rate range that is higher than the first flow rate range used by the mass flow controller.

2. The apparatus of claim 1, wherein the first control unit is provided in plural, and the plurality of first control units are respectively installed on different branch lines among the plurality of branch lines.

3. The apparatus of claim 2, wherein the plurality of mass flow controllers of the plurality of first control units control a flow rate of the drying gas within different flow rate ranges, respectively.

4. The apparatus of claim 3, wherein the plurality of mass flow controllers of the plurality of first control units have a flow rate range, sequentially increasing, for controlling the drying gas.

5. The apparatus of claim 1, wherein the first control unit has a flow restrictor installed between the first on-off valve and the mass flow controller.

6. The apparatus of claim 5, wherein the flow restrictor is at least one of an orifice, a mesh member, and a porous member.

7. A facility for processing a substrate, the facility comprising:

agas storage unit, that stores a drying gas, the drying gas being a supercritical fluid;

a process chamber for drying a substrate;

a gas supply line connecting the gas storage unit and the process chamber;

a gas discharge line connected to the process chamber; and a flow control unit installed in the gas supply line, and controlling a gas flow rate of the drying gas supplied through the gas supply line through a metering valve and a mass flow controller, the metering valve and the mass flow controller being disposed in parallel, wherein the gas supply line includes a plurality of branch lines, disposed in parallel, wherein the flow control unit includes, a second control unit having a second on-off valve and the metering valve; and a first control unit having a first on-off valve and the mass flow controller, wherein the second control unit and the first control unit are installed on different branch lines among the plurality of branch lines, wherein the mass flow controller of the first control unit controls a flow rate of the drying gas in a first flow rate range that is lower than a second flow rate range at which the metering valve of the second control unit controller the flow rate of the drying gas, wherein the second control unit is provided in plural, and the plurality of second control units are respectively installed on different branch lines among the plurality of branch lines, and wherein the plurality of metering valves of the plurality of second control units are set to have different opening rates, respectively, and the plurality of metering valves of the plurality of second control units are set to sequentially increase the opening rate to control the flow rate of the drying gas using a multilevel fixed metering rate supply control method at the second flow rate range that is higher than the first flow rate range used by the mass flow controller.

8. The facility of claim 7, wherein the plurality of first control units are provided in plural, and the plurality of first control units are respectively installed on different branch lines among the plurality of branch lines.

9. The facility of claim 8, wherein the plurality of mass flow controllers of the plurality of first control units controls the drying gas in different flow rate ranges, respectively, and the plurality of mass flow controllers of the plurality of first control units have an increased flow rate range, sequentially controlling the drying gas.

* * * * *